US012336243B2

(12) United States Patent
Derrickson et al.

(10) Patent No.: US 12,336,243 B2
(45) Date of Patent: Jun. 17, 2025

(54) LATERAL BIPOLAR TRANSISTOR WITH GATED COLLECTOR

(71) Applicant: GLOBALFOUNDRIES U.S. Inc., Malta, NY (US)

(72) Inventors: Alexander Derrickson, Saratoga Springs, NY (US); Vibhor Jain, Williston, VT (US); Judson R. Holt, Ballston Lake, NY (US); Jagar Singh, Clifton Park, NY (US); Mankyu Yang, Fishkill, NY (US)

(73) Assignee: GLOBALFOUNDRIES U.S. Inc., Malta, NY (US)

( * ) Notice: Subject to any disclaimer, the term of this patent is extended or adjusted under 35 U.S.C. 154(b) by 0 days.

(21) Appl. No.: 18/405,621

(22) Filed: Jan. 5, 2024

(65) Prior Publication Data

US 2024/0136400 A1    Apr. 25, 2024

Related U.S. Application Data

(62) Division of application No. 17/525,256, filed on Nov. 12, 2021, now Pat. No. 11,935,923.

(Continued)

(51) Int. Cl.
*H10D 62/13* (2025.01)
*H10D 10/60* (2025.01)
(Continued)

(52) U.S. Cl.
CPC .......... *H10D 62/137* (2025.01); *H10D 10/60* (2025.01); *H10D 10/80* (2025.01); *H10D 62/115* (2025.01);
(Continued)

(58) Field of Classification Search
CPC .... H10D 10/021; H10D 62/177; H10D 10/80; H10D 62/137
See application file for complete search history.

(56) References Cited

U.S. PATENT DOCUMENTS 6,638,807 B2  10/2003  Forbes et al.
6,982,442 B2   1/2006  Chan et al.
(Continued)

FOREIGN PATENT DOCUMENTS

EP            0 657 944          6/1995

OTHER PUBLICATIONS

Carter et al., "22nm FDSOI Technology for Emerging Mobile, Internet-0f-Things, and RF Applications", IEEE, International Electron Devices Meeting (IEDM), 2016, 4 pages.
(Continued)

*Primary Examiner* — Raj R Gupta
(74) *Attorney, Agent, or Firm* — Francois Pagette; Andrew M. Calderon; Calderon Safran & Wright P.C.

(57) ABSTRACT

The present disclosure relates to semiconductor structures and, more particularly, to a lateral bipolar transistor with gated collector and methods of manufacture. The structure includes: an extrinsic base region vertically over a semiconductor substrate and comprising asymmetrical sidewall spacers on opposing sidewalls of the extrinsic base region; a collector region on the semiconductor substrate and separated from the extrinsic base region by at least a first spacer of the asymmetrical sidewall spacers; and an emitter region on the semiconductor substrate and separated from the extrinsic base region by a second spacer of the asymmetrical sidewall spacers.

20 Claims, 7 Drawing Sheets

FIG. 10

Related U.S. Application Data

(60) Provisional application No. 63/236,425, filed on Aug. 24, 2021.

(51) Int. Cl.
  *H10D 10/80* (2025.01)
  *H10D 62/10* (2025.01)
  *H10D 62/17* (2025.01)
  *H10D 64/23* (2025.01)

(52) U.S. Cl.
  CPC ......... *H10D 62/134* (2025.01); *H10D 62/136* (2025.01); *H10D 62/184* (2025.01); *H10D 64/231* (2025.01)

(56) References Cited

U.S. PATENT DOCUMENTS

| | | |
|---|---|---|
| 8,288,758 B2 | 10/2012 | Ning et al. |
| 8,420,493 B2 | 4/2013 | Ning et al. |
| 8,441,084 B2 * | 5/2013 | Cai ................ H10D 10/80 257/423 |
| 8,586,441 B1 | 11/2013 | Cai et al. |
| 9,105,680 B2 | 8/2015 | Andenna et al. |
| 10,014,397 B1 | 7/2018 | Jain et al. |
| 11,575,029 B2 | 2/2023 | Derrickson et al. |
| 2004/0188802 A1 * | 9/2004 | Babcock ............ H10D 86/01 257/E29.124 |
| 2005/0151165 A1 * | 7/2005 | Chan .................. H10D 10/891 257/E29.193 |
| 2006/0060941 A1 * | 3/2006 | Sun .................... H10D 10/311 257/E21.372 |
| 2014/0312356 A1 * | 10/2014 | Vanhoucke ............ H10D 10/80 438/334 |
| 2020/0027846 A1 | 1/2020 | Chen et al. |
| 2022/0376093 A1 | 11/2022 | Derrrickson et al. |

OTHER PUBLICATIONS

Cheng et al., "Fully Depleted Soi (FDSOI) Technology", Science China Press and Springer, vol. 59,2016, 15 pages.

Chew et al., "RF Performance of 28nm PolySiON and HKMG CMOS Devices", Research Gate 2015, 4 pages.

DPMA Office Action dated Oct. 30, 2024 in German Application No. 10 2022 115 878.0, 14 pages.

* cited by examiner

LATERAL BIPOLAR TRANSISTOR WITH GATED COLLECTOR

FIELD OF THE INVENTION

The present disclosure relates to semiconductor structures and, more particularly, to a lateral bipolar transistor with gated collector and methods of manufacture.

BACKGROUND

Bipolar transistors can be vertical transistors or lateral transistors. In a vertical bipolar transistor, carriers flow in a vertical direction. Since a collector region is formed in a position deep from a wafer surface, collector resistance increases, thus limiting the transistor performance especially for high-speed operation. In addition, the transistor requires a high-concentration buried layer, a collector epitaxial layer, and a deep trench isolation, etc. Consequently, the number of process steps increases and thus does the costs. On the other hand, the lateral bipolar transistor is simpler in structure than the vertical bipolar transistor. Also, in a lateral bipolar transistor, a collector electrode can be directly brought into contact with a collector region, which is advantageous for high-speed operation.

SUMMARY

In an aspect of the disclosure, a structure comprises: an extrinsic base region vertically over a semiconductor substrate and comprising asymmetrical sidewall spacers on opposing sidewalls of the extrinsic base region; a collector region on the semiconductor substrate and separated from the extrinsic base region by at least a first spacer of the asymmetrical sidewall spacers; and an emitter region on the semiconductor substrate and separated from the extrinsic base region by a second spacer of the asymmetrical sidewall spacers.

In an aspect of the disclosure, a structure comprises: an extrinsic base region vertically over an intrinsic base region comprising semiconductor on insulator substrate material; a raised collector region on the semiconductor on insulator substrate material; a raised emitter region on the semiconductor on insulator substrate material; a first structure electrically isolating the extrinsic base region from the raised emitter region; and a second structure electrically isolating the extrinsic base region from the raised collector region, the second structure being of a different composition than the first structure.

In an aspect of the disclosure, a method comprises: forming an extrinsic base region vertically over a semiconductor substrate and comprising asymmetrical sidewall spacers on opposing sidewalls of the extrinsic base region; forming a collector region on the semiconductor substrate and separated from the extrinsic base region by at least a first spacer of the asymmetrical sidewall spacers; and forming an emitter region on the semiconductor substrate and separated from the extrinsic base region by a second spacer of the asymmetrical sidewall spacers.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to a lateral bipolar transistor with gated collector and methods of manufacture. More specifically, the lateral bipolar transistor includes a gated collector with an asymmetrical profile. In addition, the collector region comprises a depleted collector region for high voltage RF device applications (e.g., low noise amplifiers and power amplifiers.

In more specific embodiments, the lateral bipolar transistor may be a lateral SiGe heterojunction bipolar transistor. The lateral SiGe heterojunction bipolar transistor comprises, for example, a SiGe intrinsic base within a semiconductor on insulator (SOI) layer. A raised emitter region and raised collector region comprising N+ semiconductor material, e.g., Si, are above the above SOI layer, with a P+ extrinsic base region vertically contacting the SiGe intrinsic base. A gate structure, e.g., transistor, separates the extrinsic base from a collector contact. To enhance performance, the gate structure can include an optional contact, e.g., extra terminal. Also, the collector region (collector contact) formed under the gate structure may be lightly doped semiconductor material. A spacer isolates the gate structure from the extrinsic base, which can be different shapes or material compared to outer spacers.

In alternative embodiments, a spacer comprising polysilicon may isolate the collector region from the extrinsic base region. A contact can be provided to the sidewall polysilicon, and two spacers of different materials can be provided about the extrinsic base region and the polysilicon spacer. In any layout scheme described herein, the collector region is high configurable by use of the gate structure or polysilicon spacer, as examples.

The lateral bipolar transistor with gated collector of the present disclosure can be manufactured in a number of ways using a number of different tools. In general, though, the methodologies and tools are used to form structures with dimensions in the micrometer and nanometer scale. The methodologies, i.e., technologies, employed to manufacture the lateral bipolar transistor with gated collector of the present disclosure have been adopted from integrated circuit (IC) technology. For example, the structures are built on wafers and are realized in films of material patterned by photolithographic processes on the top of a wafer. In particular, the fabrication of the lateral bipolar transistor with gated collector uses three basic building blocks: (i) deposition of thin films of material on a substrate, (ii) applying a patterned mask on top of the films by photolithographic imaging, and (iii) etching the films selectively to the mask.

Figure 1:
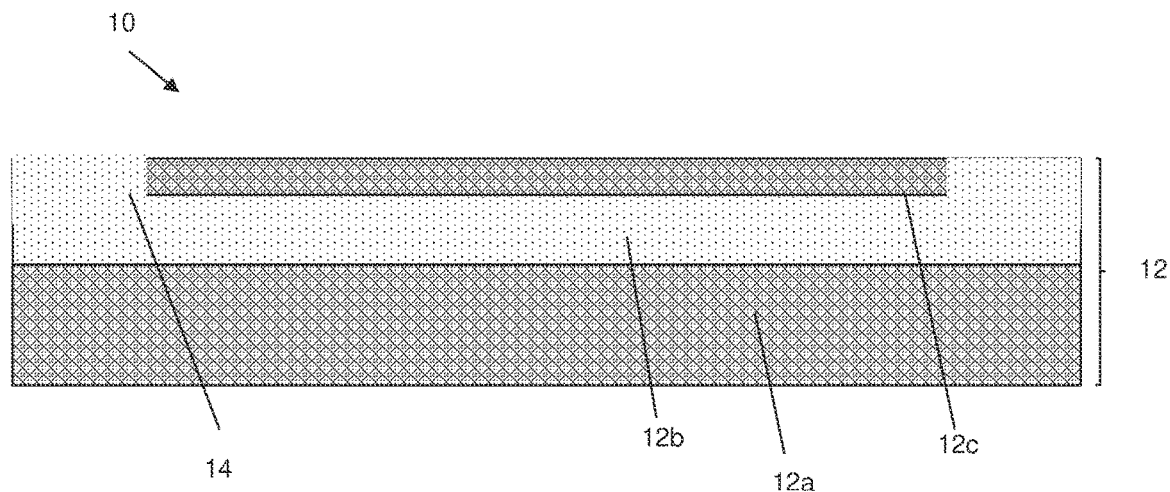
FIG. 1 shows a substrate with shallow trench isolation structures, amongst other features, and respective fabrication processes in accordance with aspects of the present disclosure.

FIG. 1 shows a substrate with shallow trench isolation structures and respective fabrication processes in accordance with aspects of the present disclosure. In particular, the structure 10 of FIG. 1 includes a substrate 12 and shallow trench isolation regions 14 formed within the substrate 12. In embodiments, the substrate 12 comprises a semiconductor-on-insulator (SOI) substrate. More specifically, the substrate 12 includes a semiconductor handle wafer 12a, an insulator layer 12b and a semiconductor layer 12c on the insulator layer 12b. The semiconductor handle wafer 12a provides mechanical support to the insulator layer 12b and the semiconductor layer 12c.

In the SOI implementation, the semiconductor handle wafer 12a and the semiconductor layer 12c may be composed of any suitable semiconductor material including, but not limited to, Si, SiGe, SiGeC, SiC, GaAs, InAs, InP, and other III/V or II/VI compound semiconductors. Moreover, the semiconductor handle wafer 12a and the semiconductor layer 12c may comprise any suitable single crystallographic orientation (e.g., a (100), (110), (111), or (001) crystallographic orientation). In further embodiments, the semiconductor layer 12c may be lightly doped Si material or SiGe, which forms part of the collector contact and intrinsic base region. In embodiments, the dopant may be N+ type dopant such as, for example, Arsenic or Phosphorus. The semiconductor layer 12c may be formed by a deposition process, such as chemical vapor deposition (CVD) or plasma enhanced CVD (PECVD). Alternatively, the semiconductor layer 12c may be formed using a smart cut process where two semiconductor wafers are bonded together with an insulator material between the two semiconductor wafers.

The insulator layer 12b may include a dielectric material such as silicon dioxide, silicon nitride, silicon oxynitride, boron nitride or a combination thereof. In a preferred embodiment, the insulator layer 12b may be a buried oxide layer (BOX). The insulator layer 12b may be formed by a deposition process, such as CVD, PECVD or physical vapor deposition (PVD). In another embodiment, the insulator layer 12b may be formed using a thermal growth process, such as thermal oxidation, to convert a surface portion of the semiconductor handle wafer 12a to an oxide material, e.g., insulator layer 12b. In yet another embodiment, the insulator layer 12b can be formed by implanting oxygen atoms into a bulk semiconductor substrate and thereafter annealing the structure.

Still referring to FIG. 1, shallow trench isolation structures 14 are formed within the semiconductor layer 12c and extend to the insulator layer 12b. In embodiments, the shallow trench isolation structures 14 can be formed by conventional lithography, etching and deposition methods known to those of skill in the art. For example, a resist formed over the semiconductor layer 12c is exposed to energy (light) to form a pattern (opening). An etching process with a selective chemistry, e.g., reactive ion etching (RIE), will be used to form one or more trenches in the semiconductor layer 12c through the openings of the resist. Following the resist removal by a conventional oxygen ashing process or other known stripants, insulator material (e.g., $SiO_2$) can be deposited within the trenches by any conventional deposition process, e.g., chemical vapor deposition (CVD) processes. Any residual insulator material on the surface of the semiconductor layer 12c may be removed by conventional chemical mechanical polishing (CMP) processes.

Figure 2:
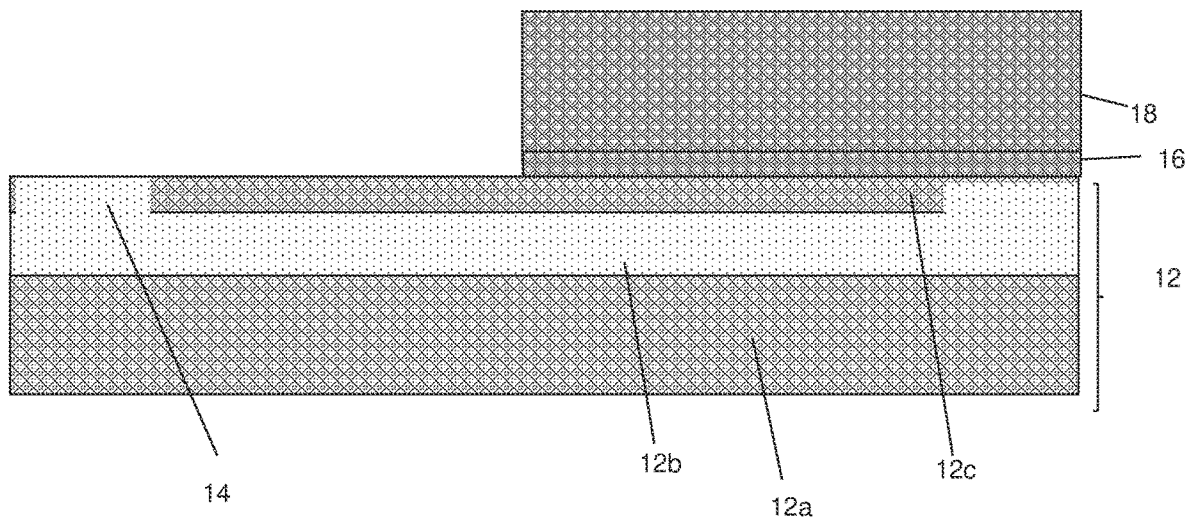
FIG. 2 shows a gate dielectric material and gate material formed on the substrate, amongst other features, and respective fabrication processes in accordance with aspects of the present disclosure.

As further shown in FIG. 2, a gate dielectric material 16 may be formed on the semiconductor layer 12c and over the shallow trench isolation structures 14. In embodiments, the gate dielectric material 16 may be a gate oxide. Alternatively, the gate dielectric material 16 may be any appropriate low-k gate dielectric material. A gate material 18 may be formed over the gate dielectric material 16. The gate material 18 may comprise work function metal(s) and polysilicon material over the work function metal(s). The gate dielectric material 16 and the gate material 18 may be deposited by conventional deposition methods such as CVD. In embodiments, the gate dielectric material 16 can be deposited to different thicknesses depending on the desired device performance. The gate dielectric material 16 and the gate material 18 may be patterned using conventional lithography and etching (RIE) processes as already described herein.

Figure 3:
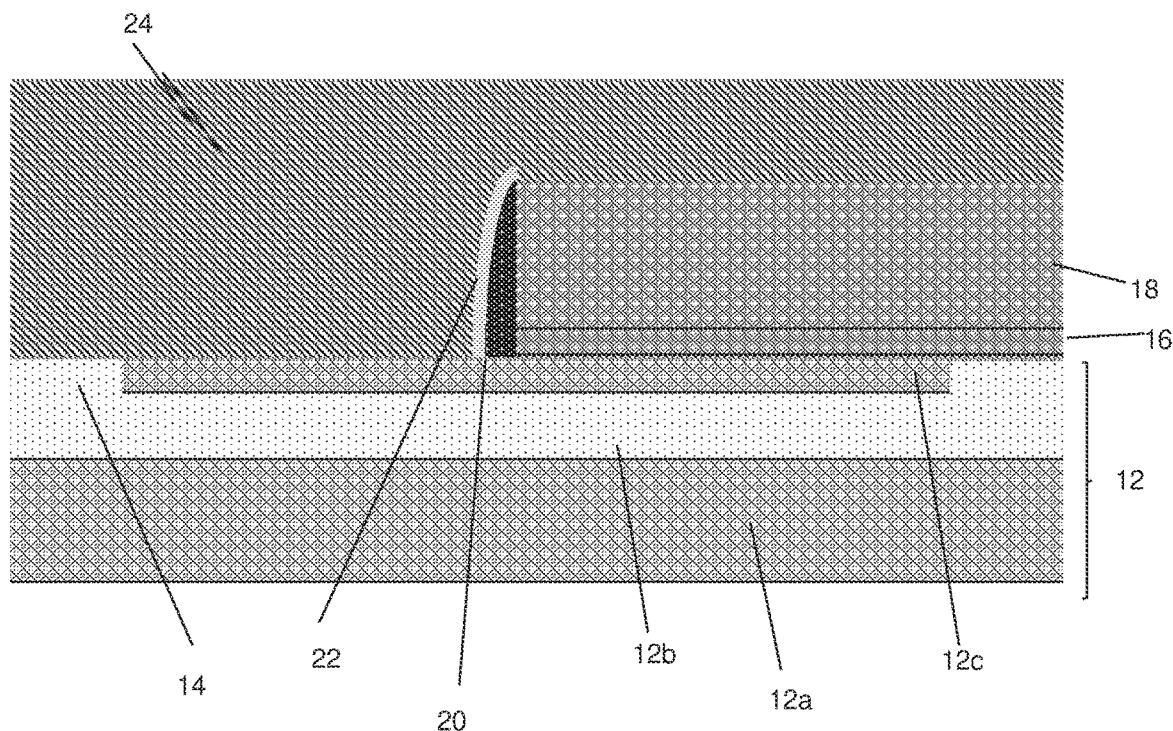
FIG. 3 shows extrinsic base polysilicon material formed on a sidewall spacer of the patterned gate dielectric material and the gate material, amongst other features, and respective fabrication processes in accordance with aspects of the present disclosure.

In FIG. 3, a sidewall spacer 20 may be formed on a sidewall of the patterned gate dielectric material 16 and the gate material 18. In embodiments, the sidewall spacer 20 may be a nitride spacer with a thin layer of oxide 22, deposited by a conventional deposition method, e.g., CVD. The spacer material 20, 22 may be subjected to an anisotropic etching process as is known in the art such that no further explanation is required for a complete understanding of the present disclosure.

In addition, polysilicon material 24 may be blanket deposited over the sidewall spacer 20 and oxide 22, in addition to the gate material 18. The polysilicon material 24 may be a P+ doped material that may be used to form an extrinsic base region of the lateral bipolar heterojunction transistor. The polysilicon material 24 may be separated from the patterned gate dielectric material 16 and the gate material 18 by the sidewall spacer 20 and oxide material 22. The polysilicon material 24 may also be in direct contact with the semiconductor layer 12c, e.g., intrinsic base region.

Figure 4:
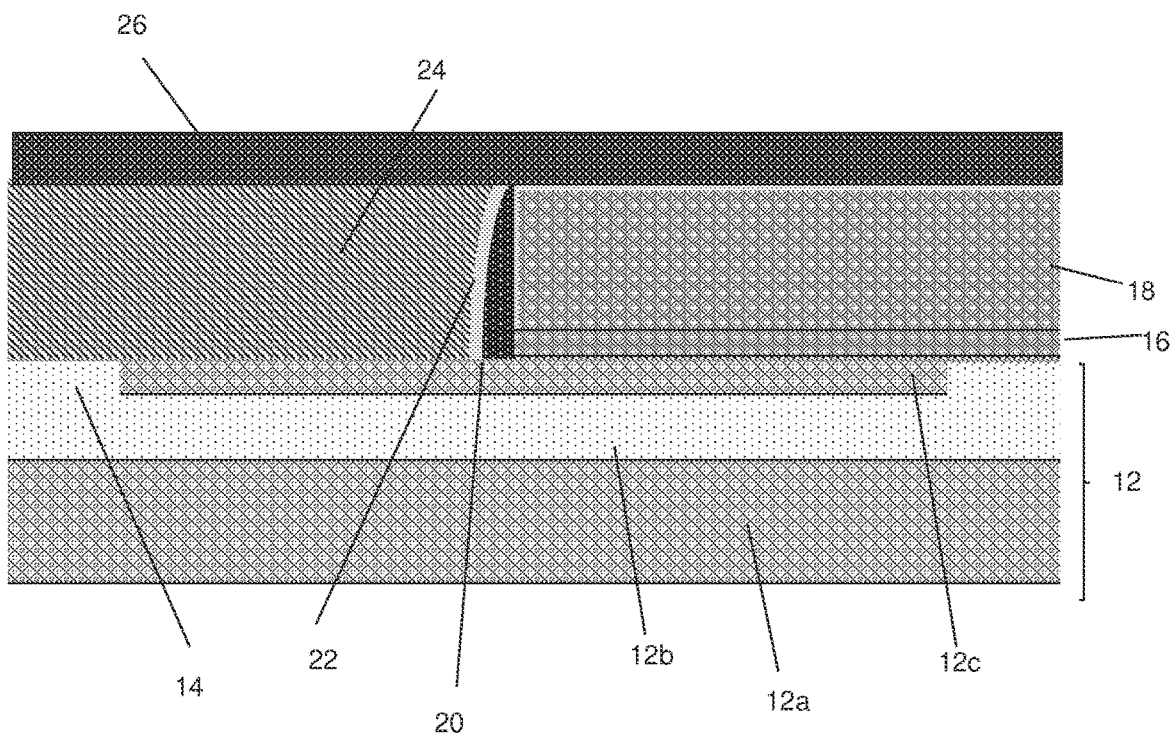
FIG. 4 shows a cap material on the extrinsic base polysilicon material, amongst other features, and respective fabrication processes in accordance with aspects of the present disclosure.

In FIG. 4, the polysilicon material 24 may be planarized to a level of the gate material 18. In embodiments, the planarization process may be a CMP process as is known in the art. In this way, a top surface of the gate material 18 will be exposed. Following the planarization process, a cap material 26 may be deposited on the gate material 18 and the polysilicon material 24. The cap material 26 may be a nitride material blanketed deposited by a conventional CVD process.

Figure 5:
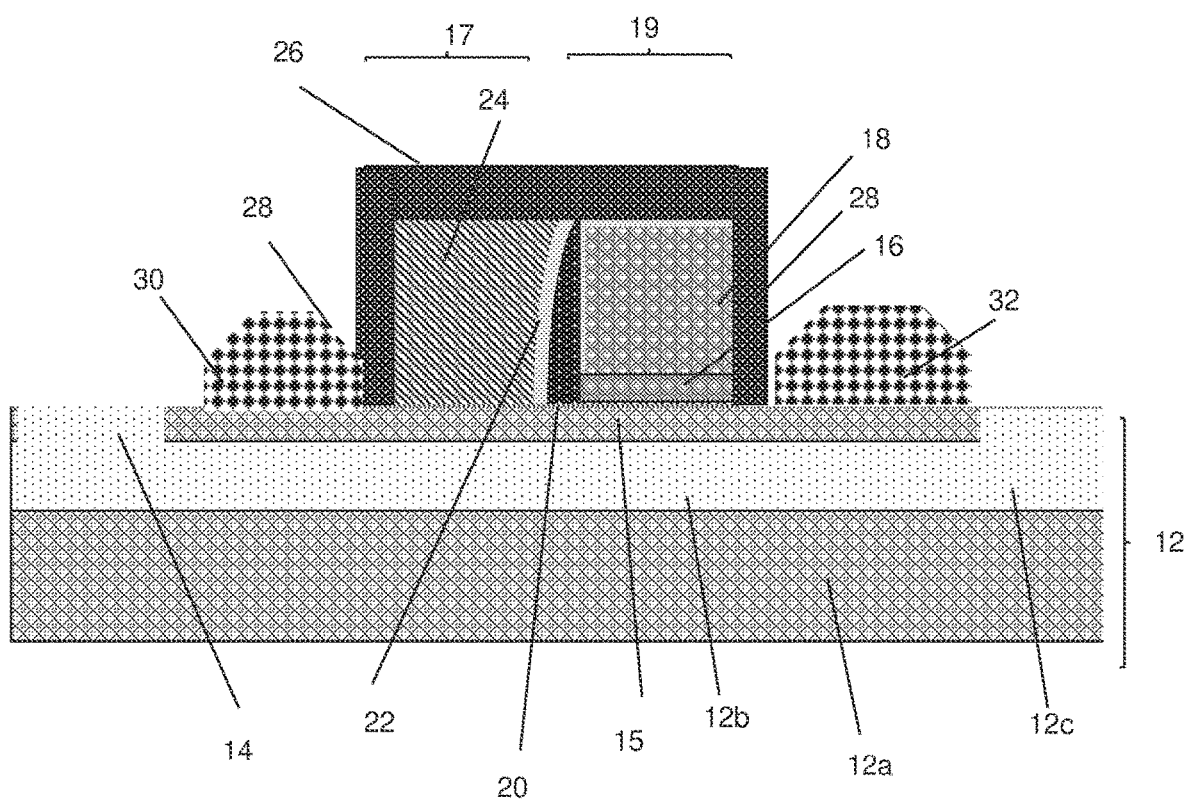
FIG. 5 shows sidewalls on the extrinsic base region and gate structure, amongst other features, and respective fabrication processes in accordance with aspects of the present disclosure.

As further shown in FIG. 5, the polysilicon material 24 and cap material 26 may be patterned by conventional lithography and etching processes as already described herein. In this way, the polysilicon material 24 may be patterned into an extrinsic base region 17 of the lateral bipolar heterojunction transistor; whereas the gate material 18 and the gate dielectric material 16 may be formed into a gate structure 19 over a collector contact region 15, e.g., lightly doped semiconductor layer 12c which electrically connects the gate structure to a raised collector region 32.

A sidewall spacer 28 may be formed on the outer sidewalls of the polysilicon material 24 and the gate structure 19 (e.g., patterned gate material 18 and gate dielectric material 16). The sidewall spacer 28 may be a nitride material deposited by a conventional deposition process, e.g., CVD, followed by an anisotropic etching process as already described herein. The sidewall spacer 28 may be a different shape and/or different material than the sidewall spacer 20. In this way, the gate structure 19 may be an asymmetrical gate structure. Also, both the gate structure 19 and the extrinsic base region 17 will have asymmetrical sidewall spacers.

Still referring to FIG. 5, an emitter region 30 and a collector region 32 (e.g., raised extrinsic collector region) are formed on the semiconductor layer 12c, adjacent to the sidewall spacer 28 of the extrinsic base 17 region and the gate structure 19. As shown in FIG. 5, the collector region 32 and the emitter region 30 may be raised formed by an epitaxial growth process. The raised collector region 32 will be in electrical contact with the collector contact region 15 (e.g., intrinsic collector region) and the gate structure 19. In embodiments, the collector contact region 15 may be Si material or SiGe material. The SiGe material may be formed by subjecting the semiconductor layer 12c to a conventional Ge condensation process as is known in the art. Also, the gate structure 19 will separate the raised collector region 32 from the extrinsic base region 17.

Still referring to FIG. 5, the raised emitter region 30 and the raised collector region 32 may be epitaxial semiconductor material grown on the semiconductor layer 12c. The epitaxial semiconductor material may be, e.g., Si material. In more specific embodiments, the epitaxial semiconductor material may be SiP material lightly doped with N+ dopants. In embodiments, the sidewalls spacers 18, 28 will electrically isolate each of the raised emitter region 30, the raised collector raised 32, the extrinsic base region 17 and the gate structure 19 from one another as should be understood by those of skill in the art.

Figure 6:
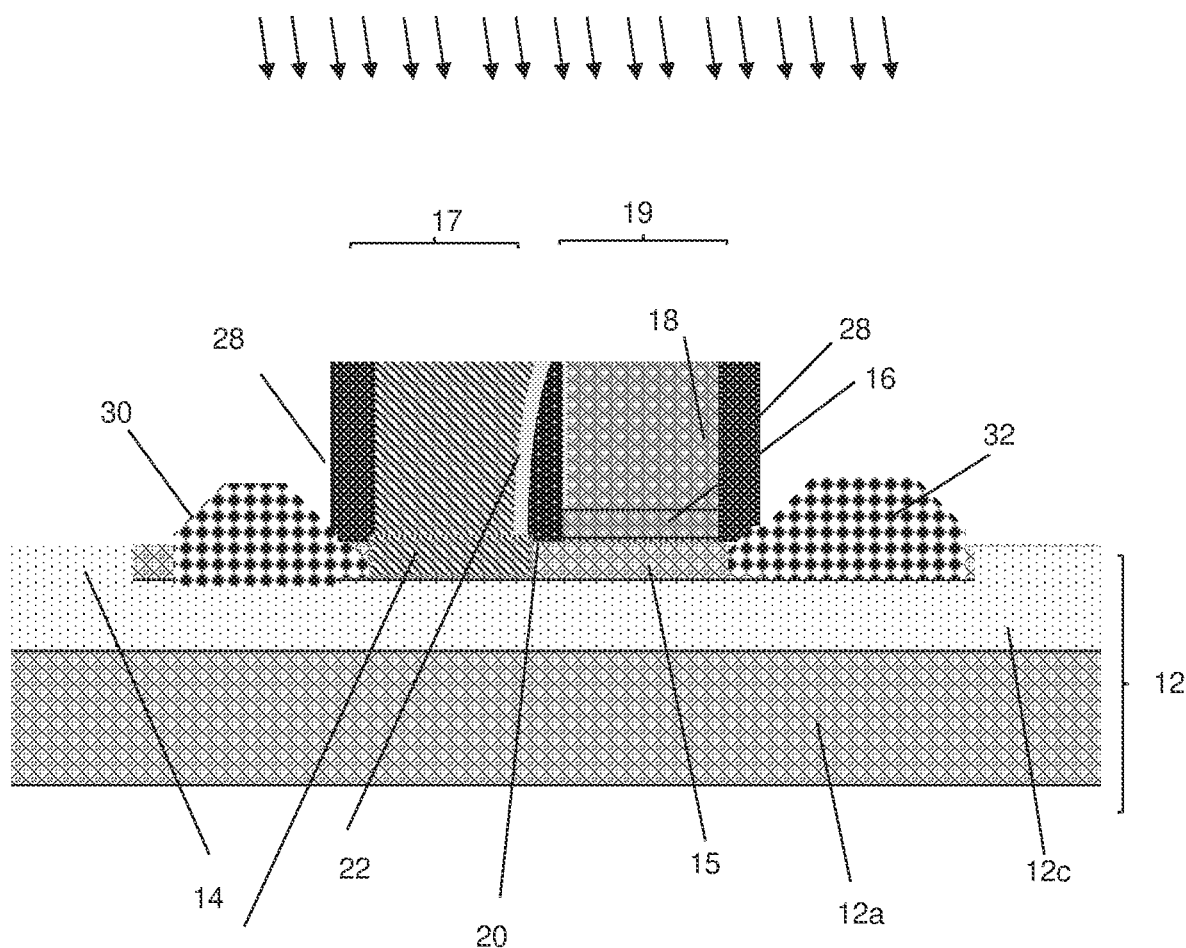
FIG. 6 shows a rapid thermal anneal process, amongst other features, and respective fabrication processes in accordance with aspects of the present disclosure.

As shown in FIG. 6, the cap material 26 may be removed by a conventional etching process, e.g., CMP. In this way, the polysilicon material 24 of the extrinsic base region 17 and the gate material 18 of the gate structure 19 can be exposed. The structure may also undergo a rapid thermal anneal process. In this way, the P+ dopant of the polysilicon material 24, e.g., extrinsic base 17, may be driven into the semiconductor layer 12c thereby forming an intrinsic base region 21. Also, the N+ dopants of the raised emitter region 30 and raised collector region 32 may be driven into the semiconductor layer 12c, where the N+ dopants of the raised collector region 32 will contact the lightly doped semiconductor layer 12c under the gate structure 19, e.g., the collector contact region 15. Accordingly, the gate structure 19 will now be in contact with the raised collector region 32 by way of the collector contact region 15 under the gate structure 19. In this way, the collector region 32 is a gated collector region.

Figure 7:
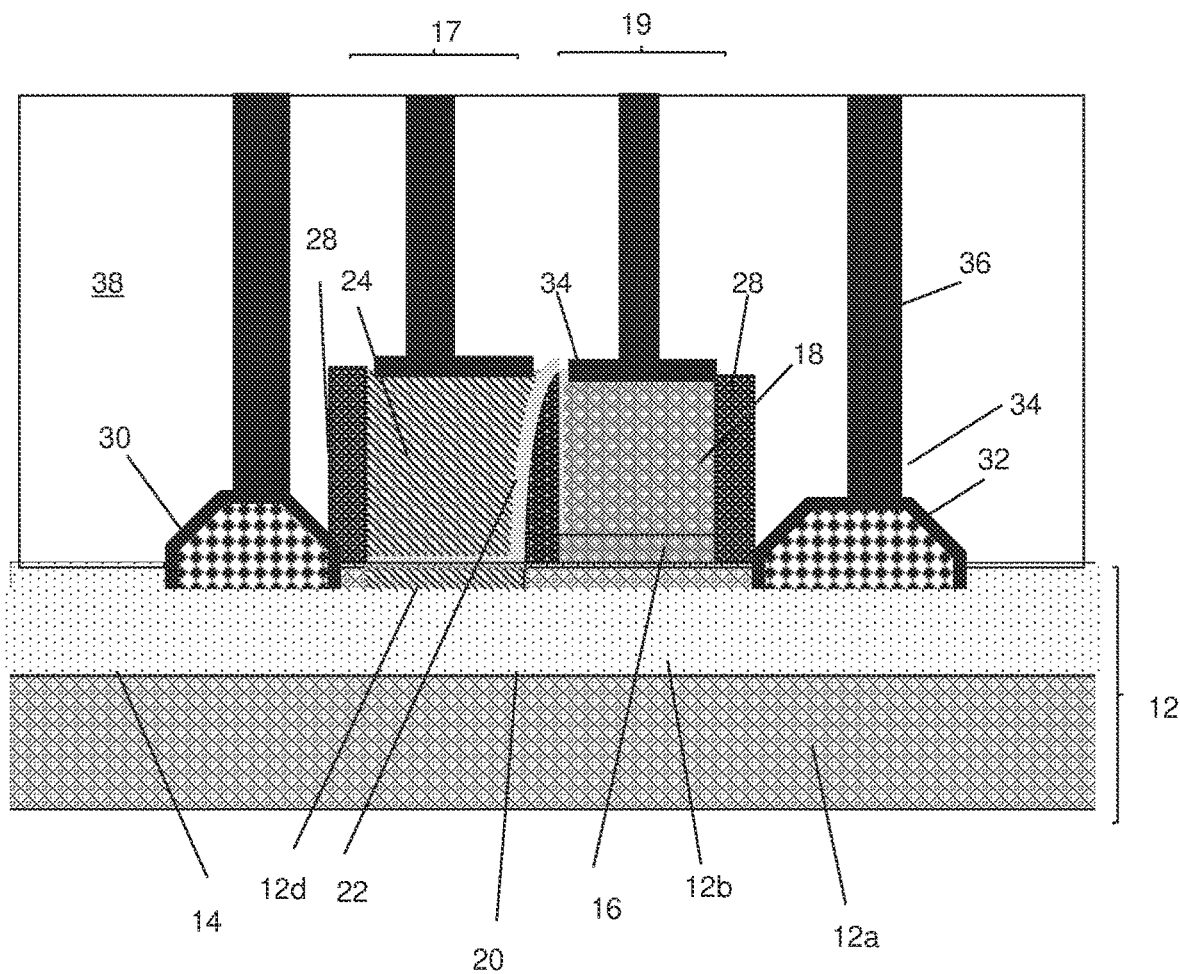
FIG. 7 shows a silicide and contacts to the extrinsic base region, collector region, emitter region and gate structure, amongst other features, and respective fabrication processes in accordance with aspects of the present disclosure.

In FIG. 7, a silicide 34 may be formed over the raised emitter region 30 and the raised collector region 32, in addition to over the polysilicon material 24 of the extrinsic base region 17 and the gate material 18 of the gate structure 19. As should be understood by those of skill in the art, the silicide process begins with deposition of a thin transition metal layer, e.g., nickel, cobalt or titanium, over fully formed and patterned semiconductor devices (e.g., extrinsic base region 17, emitter region 30, the collector region 32 and gate structure 19). After deposition of the material, the structure is heated allowing the transition metal to react with exposed silicon (or other semiconductor material as described herein) in the active regions of the semiconductor device thereby forming a low-resistance transition metal silicide. Following the reaction, any remaining transition metal is removed by chemical etching, leaving silicide contacts 34 in the active regions of the device.

Contacts 36 may be formed on the silicide 34. In embodiments, the contacts 36 may be tungsten or aluminum formed by conventional lithography, etching and deposition processes. For example, an interlevel dielectric material 38 may be deposited over the structure, followed by via formation to expose the underlying silicide 34. The vias may be formed conventional lithography and etching processes. A conductive material, e.g., tungsten or aluminum, may be deposited within the vias to form the contacts 36. Any residual material on the interlevel dielectric material 38 may be removed by a CMP process.

Figure 8:
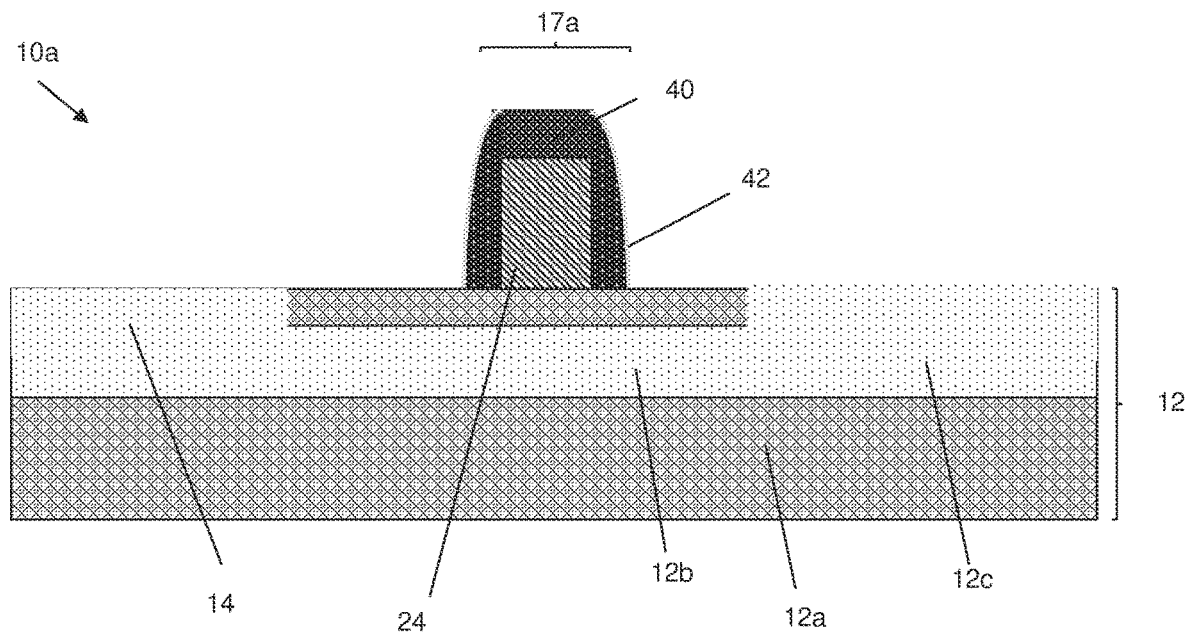
FIGS. 8-11 show an alternative structure and respective fabrication processes in accordance with aspects of the present disclosure.

FIGS. 8-11 show an alternative structure and respective fabrication processes in accordance with aspects of the present disclosure. More specifically, FIG. 8 shows a structure 10a comprising an extrinsic base region 17a formed on a substrate 12. In embodiments, the substrate 12 includes the semiconductor handle wafer 12a, the insulator layer 12b and the semiconductor layer 12c on the insulator layer 12b as described above. In embodiments, the semiconductor layer 12c may be Si or SiGe material. In embodiments, the SiGe material may be formed by a conventional Ge condensation method as noted already herein.

The extrinsic base 17a may comprise polysilicon material 24 with a sidewall spacer 42 and cap material 40 as already described herein. For example, the polysilicon material 24 and cap material 40 may be blanket deposited over the substrate 12, followed by a patterning process and sidewall spacer formation. The polysilicon material 24 may be a P+ doped material that is used as an extrinsic base region of the lateral bipolar heterojunction transistor.

Figure 9:
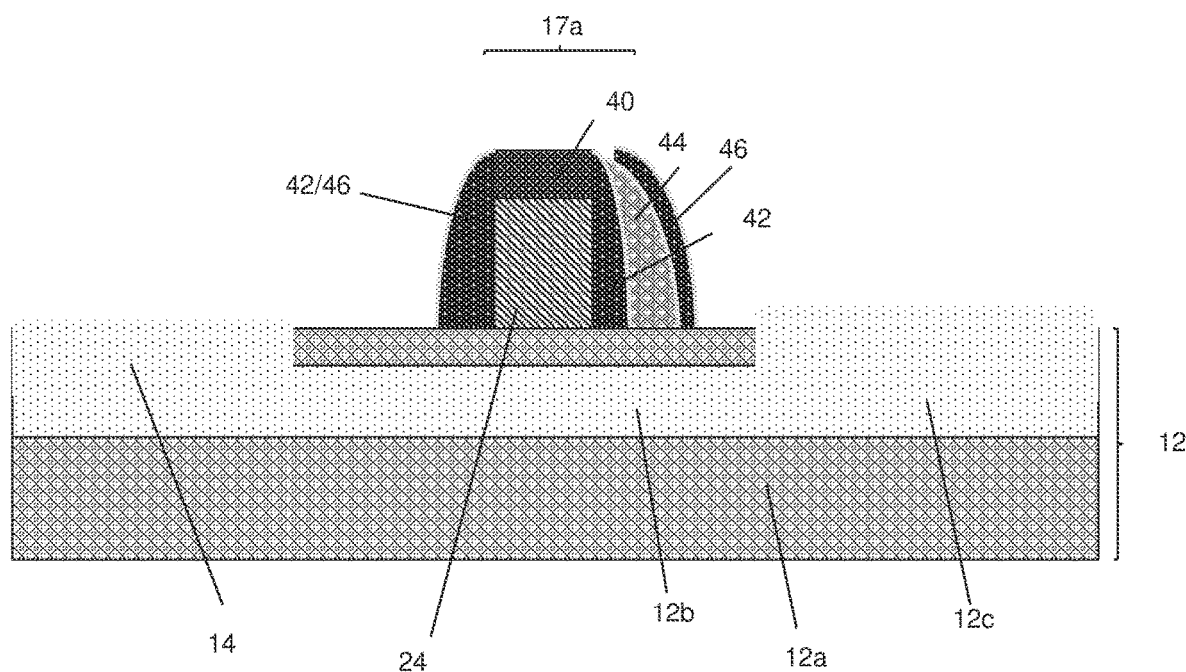

As further shown in FIG. 9, a polysilicon material 44 may be formed on the sidewall spacer 42. In embodiments, the polysilicon material 44 may be epitaxially grown on the semiconductor layer 12c, followed by a patterning process. In this way, the polysilicon material 44 forms a sidewall of the extrinsic base 17a. A sidewall spacer 46 may then be formed over the polysilicon material 44 and the spacer 42. The sidewall spacers 46 may be a nitride material and/or oxide material formed by a conventional blanket deposition process followed by an anisotropic etching process. The sidewall spacers 46 may be a nitride material and/or oxide material formed by a conventional blanket deposition process followed by an anisotropic etching process.

The sidewall spacers 42/46 electrically isolate the extrinsic base region 17 from the raised emitter region 30. Also, the sidewall spacers 42/46 are thicker than the sidewall spacer 46, which electrically isolates the polysilicon material 44 from the raised collector region 32. Hence, the combination of the polysilicon material 44, extrinsic base region 17 and respective sidewall spacers 42/46 will form an asymmetrical structure.

Figure 10:
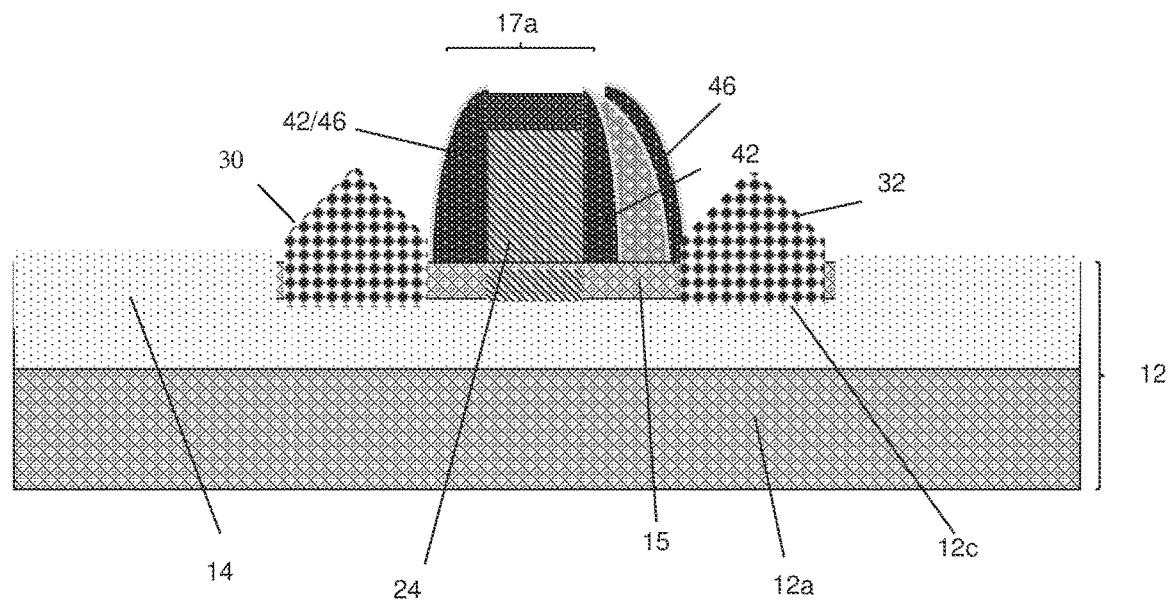

In FIG. 10, the raised emitter region 30 and raised collector region 32 (e.g., raised extrinsic collector region) may be formed on the semiconductor layer 12c, adjacent to the sidewall spacer 46 of the extrinsic base region 17a and the polysilicon material 44. As shown in FIG. 10, the raised collector region 32 will be in electrical contact with the collector contact region 15 (e.g., intrinsic collector region). In embodiments, the collector contact region 15 may be Si material or SiGe material as is known in the art and already described herein. The raised emitter region 30 and the raised collector region 32 may be epitaxial semiconductor material grown on the semiconductor layer 12c, e.g., SiP material lightly doped with N+ dopants.

Figure 11:
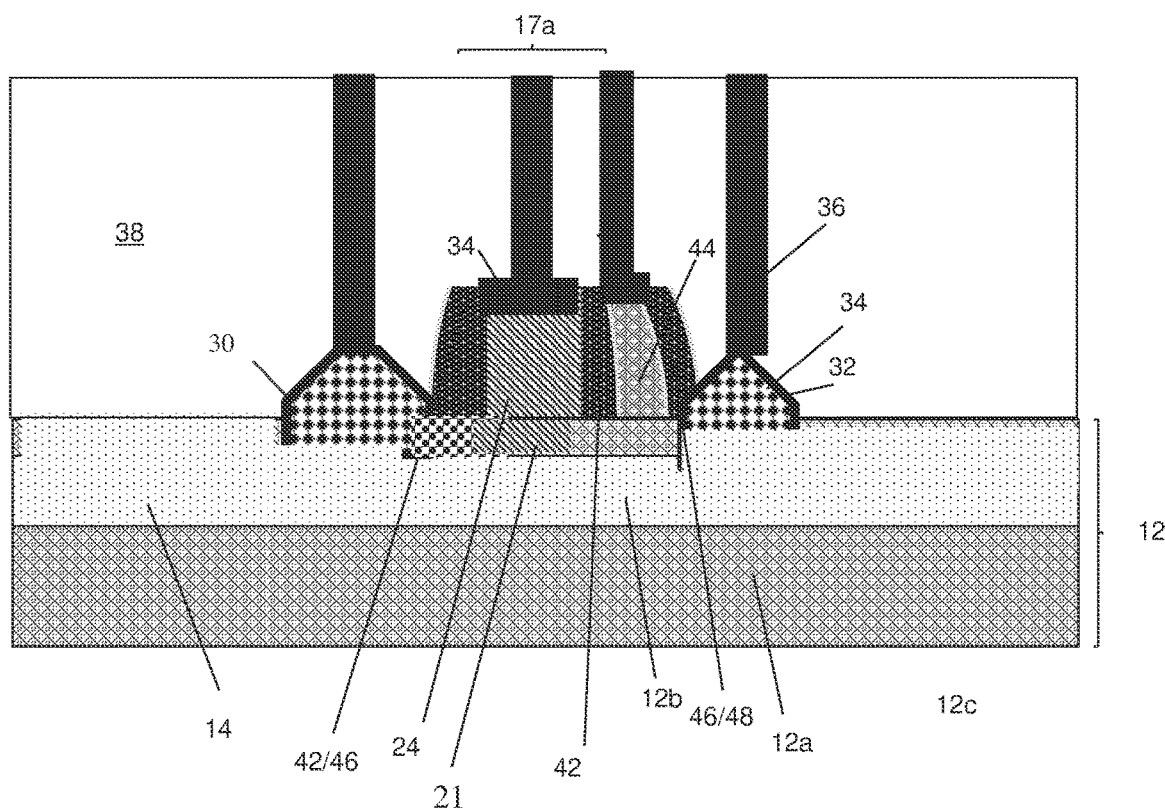

As further shown in FIG. 11, the cap material 40 may be removed by a conventional etching process, e.g., CMP. In this way, the polysilicon material 24, 44 are now exposed. The structure may also undergo a rapid thermal anneal process. In this way, the P+ dopant of the polysilicon material 24, e.g., extrinsic base 17, may be driven into the semiconductor layer 12c thereby forming an intrinsic base region 21. Also, the N+ dopants of the raised emitter region 30 and raised collector region 32 are driven into the semiconductor layer 12c, where the N+ dopants of the raised collector region 32 will contact the lightly doped semiconductor layer 12c under the polysilicon material 44.

In FIG. 11, a silicide 34 may be formed over the raised emitter region 30 and the raised collector region 32, in addition to over the polysilicon material 24, 44. Contacts 36 may be formed contacting the silicide 34 as already described herein such that no further explanation is needed for an understanding of the present disclosure.

The transistor can be utilized in system on chip (SoC) technology. The SoC is an integrated circuit (also known as a "chip") that integrates all components of an electronic system on a single chip or substrate. As the components are integrated on a single substrate, SoCs consume much less power and take up much less area than multichip designs with equivalent functionality. Because of this, SoCs are becoming the dominant force in the mobile computing (such as in Smartphones) and edge computing markets. SoC is also used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
   an extrinsic base region vertically over a semiconductor substrate and comprising asymmetrical sidewall spacers on opposing sidewalls of the extrinsic base region;
   a collector region on the semiconductor substrate and separated from the extrinsic base region by at least a first spacer of the asymmetrical sidewall spacers;
   an emitter region on the semiconductor substrate and separated from the extrinsic base region by a second spacer of the asymmetrical sidewall spacers; and
   a polysilicon spacer adjacent to the first spacer and electrically contacting to the collector region.

2. The structure of claim 1, further comprising a sidewall spacer on the polysilicon spacer, wherein the sidewall spacer separates the collector region from the polysilicon spacer and the first spacer separates the gate structure from the extrinsic base structure.

3. The structure of claim 1, further comprising a doped semiconductor contact region under the polysilicon spacer, the doped semiconductor contact region connecting the polysilicon spacer to the collector region.

4. The structure of claim 3, further comprising a contact electrically connecting to the polysilicon spacer.

5. The structure of claim 1, wherein the collector region is a raised collector region and the emitter region is a raised emitter region.

6. The structure of claim 5, wherein the raised collector region and the raised emitter region comprise epitaxial Si material.

7. The structure of claim 6, wherein the epitaxial Si material comprises SiP material.

8. The structure of claim 7, wherein the SiP material is doped with N+ dopants.

9. The structure of claim 1, wherein the polysilicon spacer is sandwiched between the first spacer and an outer sidewall spacer.

10. The structure of claim 9, wherein the raised collector is separated from the extrinsic base by the first spacer, the polysilicon spacer and the outer sidewall spacer.

11. The structure of claim 1, wherein the first spacer is a different dimension than the second spacer.

12. The structure of claim 11, wherein the first spacer includes material from an outer sidewall spacer on the polysilicon spacer.

13. A structure comprising:
   an extrinsic base region vertically over an intrinsic base region comprising semiconductor on insulator substrate material;
   a raised collector region on the semiconductor on insulator substrate material;
   a raised emitter region on the semiconductor on insulator substrate material;
   a first spacer electrically isolating the extrinsic base region from the raised emitter region; and
   a second spacer electrically isolating the extrinsic base region from the raised collector region, the second spacer being of a different composition than the first spacer.

14. The structure of claim 13, wherein the first spacer comprises a sidewall spacer and the second spacer comprises a polysilicon spacer electrically connected to the raise collector region.

15. The structure of claim 14, further comprising spacer material on opposing sidewalls of the polysilicon spacer includes.

16. The structure of claim 15, wherein the spacer material being thinner than a spacer on the extrinsic base region which isolates the extrinsic base region from the raised emitter region.

17. The structure of claim 13, wherein the intrinsic base region comprises SiGe.

18. The structure of claim 13, wherein the first spacer has a different dimension than spacer material underneath the second spacer.

19. The structure of claim 18, wherein the first spacer and the spacer material underneath the second spacer comprise an asymmetrical spacer surrounding the extrinsic base region.

20. A method comprising:
- forming an extrinsic base region vertically over a semiconductor substrate and comprising asymmetrical sidewall spacers on opposing sidewalls of the extrinsic base region;
- forming a collector region on the semiconductor substrate and separated from the extrinsic base by at least a first spacer of the asymmetrical sidewall spacers;
- forming an emitter region on the semiconductor substrate and separated from the extrinsic base region by a second spacer of the asymmetrical sidewall spacers; and
- forming a polysilicon spacer adjacent to the first sidewall spacer and electrically contacting to the collector region.

* * * * *